United States Patent [19]

Horvah

[11] Patent Number: 4,696,351

[45] Date of Patent: Sep. 29, 1987

[54] ASSEMBLY ROBOT WITH REACTION ABSORBING PLATFORM

[75] Inventor: Laszlo S. Horvah, Geneva, Switzerland

[73] Assignee: C O D Inter Techniques SA, Geneva, Switzerland

[21] Appl. No.: 726,893

[22] PCT Filed: Aug. 22, 1984

[86] PCT No.: PCT/CH84/00132
§ 371 Date: Apr. 23, 1985
§ 102(e) Date: Apr. 15, 1985

[87] PCT Pub. No.: WO85/01003
PCT Pub. Date: Mar. 14, 1985

[30] Foreign Application Priority Data

Aug. 26, 1983 [CH] Switzerland .................. 4691/83

[51] Int. Cl.⁴ ............................................. B21J 13/04
[52] U.S. Cl. ....................................... 173/32; 173/139
[58] Field of Search .................................. 173/31–37,
173/162 R, 139; 408/87, 146; 409/204, 206,
190, 191; 248/657, 651; 901/6, 7; 29/525, 254,
281.3, 33 K, 52

[56] References Cited

U.S. PATENT DOCUMENTS

| 2,843,361 | 7/1958 | Miller | 173/36 |
| 2,917,953 | 12/1959 | Badali | 173/36 |
| 2,964,305 | 12/1960 | Samhammer et al. | 173/162 |
| 3,103,136 | 9/1963 | Bollar | 173/139 |
| 3,125,172 | 3/1964 | Tilden | 173/36 |
| 3,548,699 | 8/1969 | Gerber | 173/31 |
| 3,750,764 | 8/1973 | Vogeleer | 173/139 |
| 4,274,495 | 6/1981 | Otto | 173/162 R |
| 4,523,363 | 6/1985 | Mizutani et al. | 29/235 |

FOREIGN PATENT DOCUMENTS 1133964 7/1962 Fed. Rep. of Germany .
2647734 3/1978 Fed. Rep. of Germany .

Primary Examiner—E. R. Kazenske
Assistant Examiner—James L. Wolfe
Attorney, Agent, or Firm—Trexler, Bushnell, Giangiorgi & Blackstone, Ltd.

[57] ABSTRACT

The robot comprises at least one holder (10) for the parts (11) in an assembly area and a head (1) carrying the assembly tool (21). The head is translatingly and/or rotationally movable with respect to the part holder by guiding supports (3) and is positioned by motors (6). The head carries in a fixed or sliding mode a device (20) enabling to apply the tool (21) to a part (11) with a predetermined force. The robot further comprises at least one platform (15) facing the holder so that the head (1) is located between the platform and the part holder. The platform (15) is mechanically connected to the part holder by rigid elements (5) arranged outside the space between the assembly area and the platform so as to resist a force tending to take the platform away from the holder.

10 Claims, 5 Drawing Figures

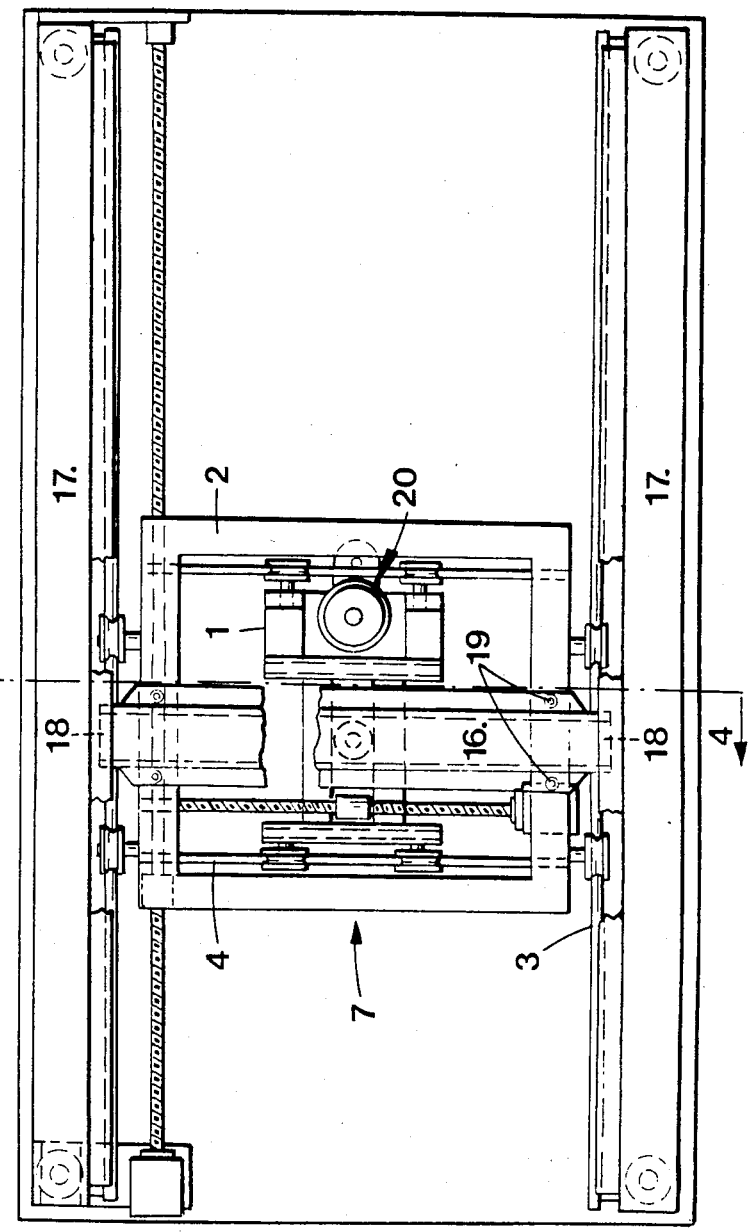

ASSEMBLY ROBOT WITH REACTION ABSORBING PLATFORM

The present invention relates to a robot for assemblying parts of a manipulating or a nonmanipulating type, and more particularlty to a robot comprising at least one holder for the parts in an assembly area and a head carrying the assembly tool and translatingly and/or rotationally movable with respect to the part holder by means of guiding supports. The head is positioned by motors and carries in a fixed or sliding mode a device for applying the tool to a part with a predetermined force.

At present, the use of industrial robots is becoming increasingly diversified: new sections of the industry are progressively introducing the use of robots into areas where they were previously unknown; also, the operations robots are required to carry out are evolving to become for example more complex, more delicate or more accurate.

Certain robots are required to carry out operations implying the use of a mechanical force which is sometimes important. When the mobile components of a robot are lightly built for allowing them to move at a high speed, they are unable to absorb the reaction resulting from the application of a force to the part. In the case of robots referred to as nonmanipulating robots, such as for example the portal-type robots, this problem has found no solution up to now. Consequently, many operations cannot be performed by portal-type robots, and auxiliary instruments have to be used, or the operations even have to be carried out manually. The robot of the invention can be advantageously used for overcoming the difficulties encountered in this case. To achieve this purpose, the robot of the invention is provided with the characteristic features described in claim 1.

The appended drawings illustrate purely by way of examples certain embodiments of the invention, or details of certain of said embodiments. It should be noted that the scope of the invention is in no way limited to the embodiments which are represented in the drawings.

FIG. 5 is a plan view of the embodiment shown in FIG. 4.

Figure 1:
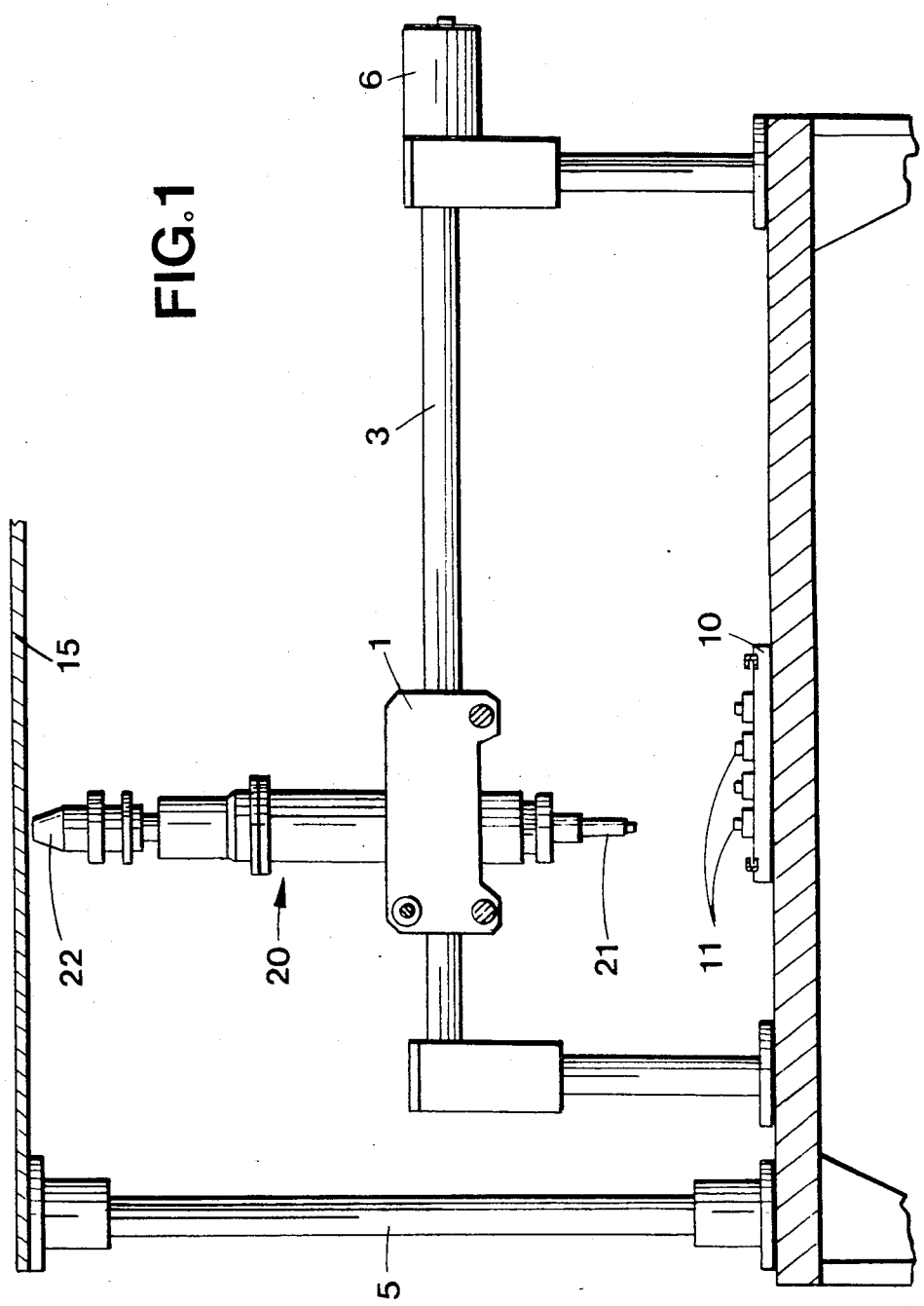
FIG. 1 is a side view of one of the embodiments of the invention.

Referring now to the embodiment of the invention illustrated in FIG. 1, the robot comprises at least one holder 10 for the parts 11 in an assembly area. A head 1 is translatingly and/or rotationally movable with respect to the holder 10 and can have for example 2 or 3 degrees of freedom. The head 1 is moved on guiding supports, of which only one 3 can be seen in FIG. 1. The other guiding support 4 (see FIG. 5) is oriented perpendicularly to the drawing. A motor 6 is used to move the head along the guiding support 3 shown in FIG. 1. A guiding support for enabling a vertical movement of the head has been omitted in this embodiment, but can be provided without difficulty in other embodiments.

The various movements of the working head 1 are generated and controlled by usual components, such as for example servomotors 6 rotating worms. The working head 1 is moved along the guiding supports in the usual manner; the sliding along the guiding supports 3, 4 can be ensured for example by using rollers of a conventional type.

The control of the robot assembly can also be ensured by conventional means; such means are generally hydraulic, pneumatic, or electric. Further, the system is generally controlled by one or several microprocessors, or even by a computer (not illustrated in the drawings).

According to the invention, the robot comprises a device 20 to enable the application of a mechanical force by a tool 21 to a part 11.

This device can be carried in a fixed mode by the head, but in the embodiment of FIG. 1 the device is slidingly movable with respect to the head 1 in the direction of the force which is applied to the part. The means enabling this sliding motion will be described hereafter in the descriptions referring to the FIGS. 2 and 3. For applying a force to the part, the device is provided with a hydraulic jack, which will also be described hereafter in the descriptions referring to the FIGS. 2 and 3. The hydraulic jack can be controlled by usual means to provide a determined spacing between its two ends, of which one bears the tool 21 which transmits the force to a part 11 of the holder 10. The reaction to this force is transmitted through a bearing part 22 perpendicularly to the platform 15 which functions to absorb this reaction force. For this purpose, the platform is connected mechanically—at least during the time when the force is applied—by rigid elements 5 to the holder 10 for the part 11, thus providing means for resisting the force exerted by the two ends of the jack. Under these circumstances, when a force is applied to the part 11, neither this force, nor the reaction to this force which is exerted on the platform 15 impose any stresses on the guiding supports 3, 4. These supports can therefore be lightly built to allow the robot head 1 to move at a high speed, which could not be realized with a head mounted on guiding supports sufficiently heavy to absorb on their own the reaction to the force applied on the part.

Further to the device 20, the head 1 can also carry means (not illustrated) for taking parts or components from one place of the working area and transferring them to another place and/or on the part before the application of the force on the part by the device 20.

Figure 2:
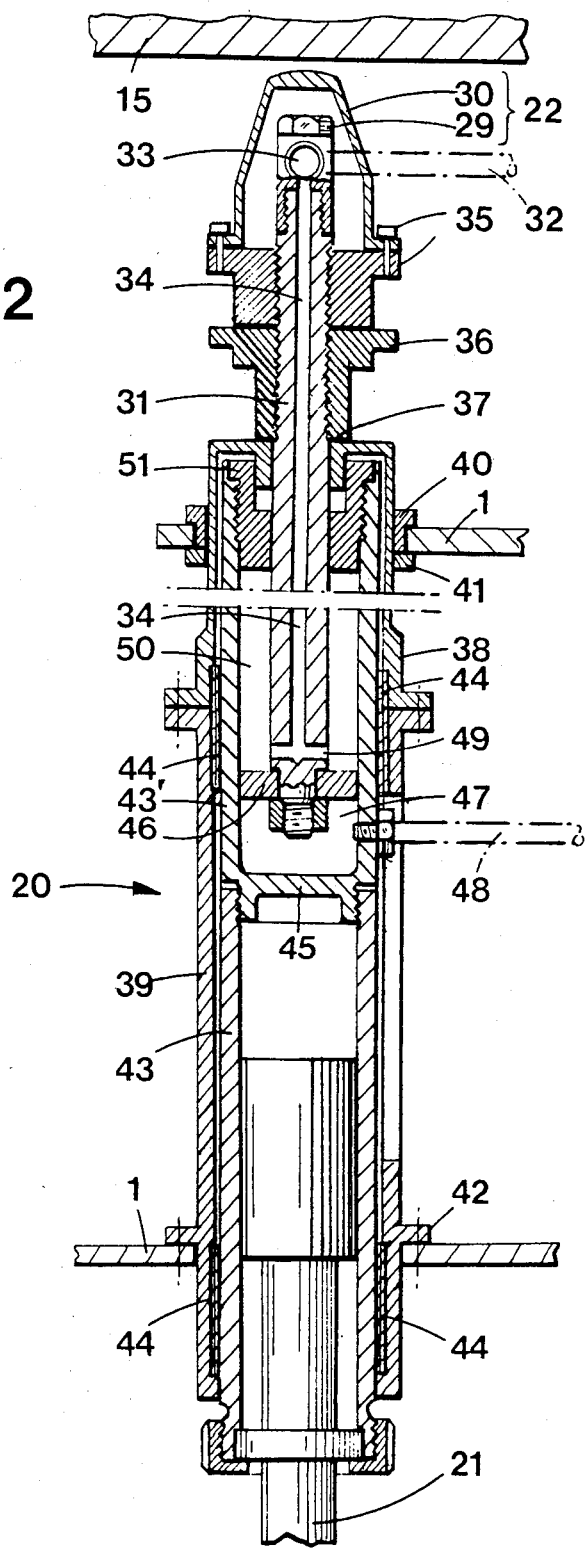
FIG. 2 is a sectional view showing the device enabling to apply a force on the tool.

A preferred version of the device 20 comprising a jack is illustrated in FIG. 2.

A protective cap 30 covers the upper end 29 of a piston rod 31 to form with said upper end the bearing part 22. A hydraulic or pneumatic transmission pipe 32 enters through said cap for communication with the upper end 33 of a hole 34 bored along the axis of the rod 31. The cap 30 is maintained on the rod by means of a nut 35 and a lock nut 36. The lock nut 36 further functions as an adjusting ring with its lower end abutting against the upper surface 37 of the upper part of the tubular housing 38, 39. In its upper part, the device 20 is fixed to the working head by means of one or several cooperating rings 40, 41. In its lower part, the device cooperates with the head 1 through a shoulder 42 provided on the surface of the lower part of the housing 38, 39.

An inner tube 43,43' is fitted inside said housing to slide in contact with the bearings 44. The tool 21 is fixed by an appropriate means to the lower part of the tube 43, 43'. In the median part of said tube 43, 43', there is provided a tight inner wall 45, the tightness and the fixation of which are ensured by usual means (screws, seals, . . . ). In its upper part and above said tight wall, said tube 43 comprises a piston 46 appropriately fixed to the base of the hollow rod 31 mentioned above. A compartment 47 is thus formed, which communicates with a second pneumatic or hydraulic transmission pipe 48.

The hole 34 communicates through the opening 49 located above the piston 46 with the compartment 50. The tightness of said compartment 50 can be ensured at the upper end by a nut 51, or by any other similar means.

Except for the protective cap 30, the pipe 32 and the pipe 48 which are preferably made of a flexible plastic material, the other constitent elements described above are most generally made from metal. The bearings on which the inner tube 43, 43' slides can be made from a plastic material, preferably hard, or from metal.

Various ancillary control means such as for example springs, valves, electrovalves, are not illustrated in the drawings. They are known means, and are used in a conventional way.

The operations of the device 20 to produce a mechanical force will be described in the following. In the first phase, a pressure is exerted inside the compartment 47 through the pipe 48. As a result of this pressure applied on the lower face of the piston 46 which is integral with the rod 31, said rod and the elements 30, 35, 36 and 37 fixed thereto are subjected to a vertical movement directed upwards. When this movement is terminated, the rod 31 is found abutting against the plate 15. The cap 30 then functions as a mechanical and a sonic protection. During this operation, no counterpressure is applied to the inside of the compartment 50. Simultaneously, and as a result of the pressure exerted on the upper face of the wall 45, the inner tube 43 bearing the tool 21 is subjected to a vertical movement directed downwards to apply the tool on a part with a predetermined force.

Accordingly, the mobile parts of the jack, i.e. 29, 30, 31 and 43, 43' are pushed aside and away from the parts 40, 42 by which the jack 20 is fixed to the head 1.

In a second phase, a pressure is exerted inside the compartment 50 through the hole 32 and the pipe 34, while at the same moment the pressure inside the compartment 47 is released as the tube 43, 43' and its tool 21 reach their downmost position. As a result of the pressure exerted on the upper face of the piston 46, the rod 31 is subjected to a vertical movement directed downwards to resume its initial position where the ring 36 abuts against the upper part 37 of the housing 38. At the same time, and as a result of the pressure exerted on the lower face of the nut 51, the tube 43, 43' and its tool 21 are subjected to a vertical movement directed upwards, to also resume their initial position.

These successive operations can be repeated practically indefinitely; they are most generally controlled by the control system of the robot.

Figure 3:
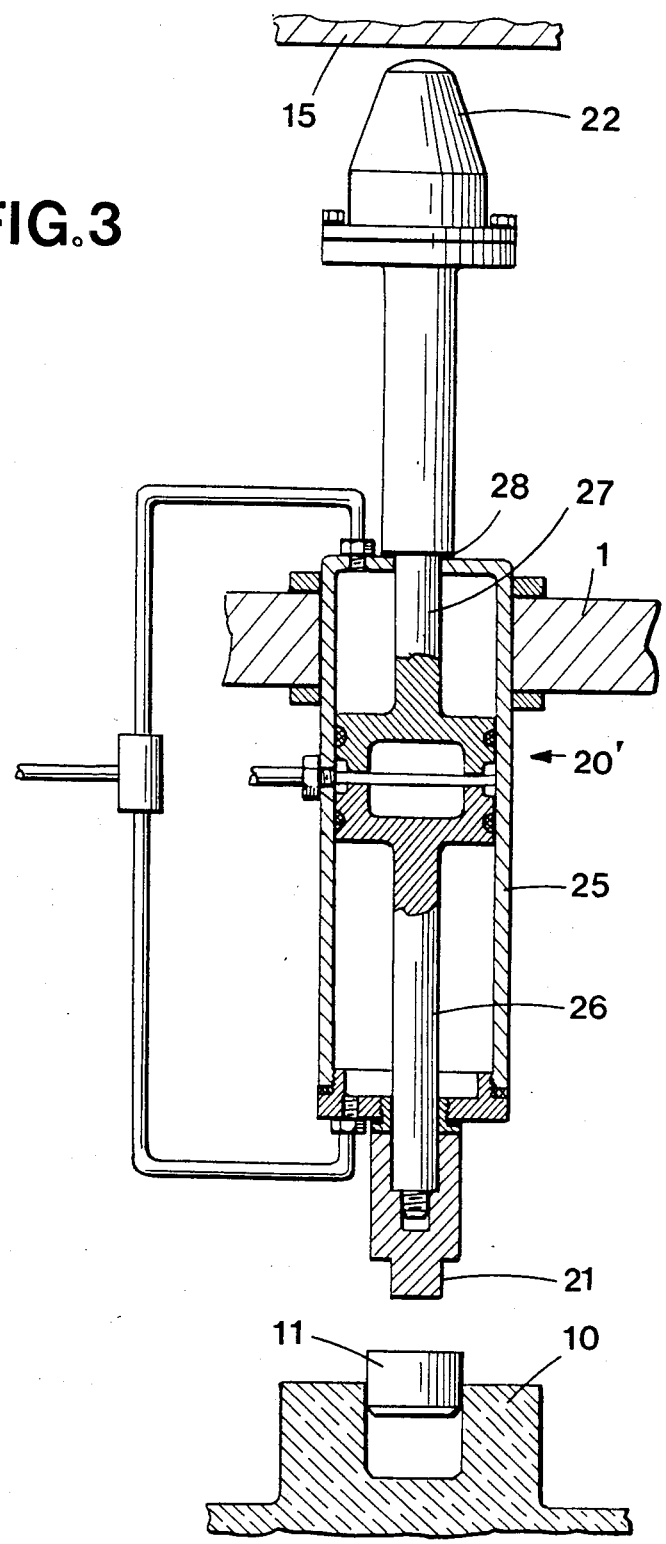
FIG. 3 is a sectional view showing another version of the device enabling to apply a force on the tool.

FIG. 3 shows a jack 20' provided with two oppositely disposed pistons 26 and 27, the rods of which carry respectively the bearing part 22 and the tool 21. The body 25 can be carried in a fixed and nonsliding mode by the head 1. The diameter of the pistons 26, 27 and of their respective compartments are equal, so that the forces produced by the two pistons are equal and balanced, and no force is therefore exerted on the head 1.

In both FIGS. 2 and 3 a stop 28 can be seen; this stop has the following function : when the jack is retracted and the bearing part 22 is sufficiently away from the platform 15, the stop 28 prevents it from moving further, and the part of the jack bearing the tool 21 is forced to move away from the holder 10 for the part 11. Accordingly, the space above the part 11 is made free, and the part becomes easily accessible, whether for inspecting the part or for replacing it.

In most cases, but this is not compulsory, the head 1 of the robot is moved along two cartesian co-ordinates and the force is exerted in the direction of the third cartesian co-ordinate. The platform 15 being perpendicular to the direction of the force, is therefor parallel to the plane defined by the two first co-ordinates. Often, the platform 15 is mounted in a fixed position.

Quite obviously, when a force is to be applied on a part from some other direction than discussed above, the reaction to this force must be absorbed by a platform positioned perpendicularly to the direction of this force; if the operations the assembling robot is required to carry out imply the exertion of a force from several directions, several appropriately oriented platforms can be provided. This version of the invention is not illustrated in the drawings.

Figure 4:
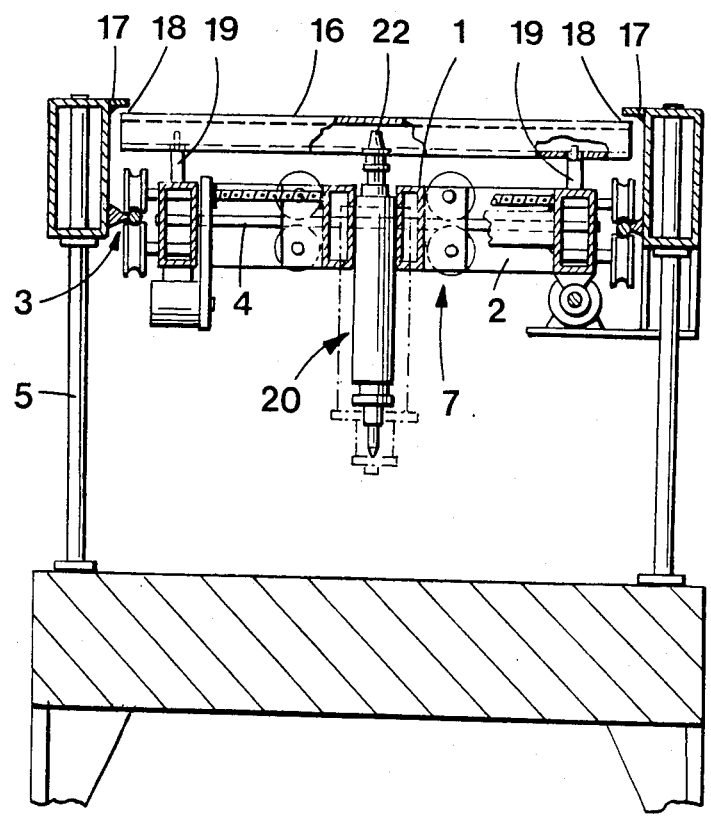
FIG. 4 is a vertical sectional view of a preferred embodiment of the invention.

Another embodiment of the invention will now be described with reference to the FIGS. 4 and 5. FIG. 4 is a sectional view of the robot taken along the line 4—4 of FIG. 5. To make the robot, the platform and the rigid structure 5 connecting the platform to the holder 10 for the parts 11 lighter, the fixed platform recovering the whole working area is replaced by a platform 16 which is translatingly or rotationally movable. In the case of a translation, such a platform has the shape of a movable beam 16 which can be clearly seen in FIG. 4. When the jack 20 exerts a force, the bearing part 22 transmits the reaction force to the movable beam 16, which in the embodiment of FIG. 4 has the shape of an inverted "U" when viewed in cross section. The ends 18 of the movable beam 16 are then pushed against the fixed beams which can withstand the reaction force because they are rigidly connected by the elements 5 to the holder 10 for the parts 11. When the jack 20 is retracted, a gap appears between the ends of the movable beam and the fixed beams; this gap can be clearly seen in FIG. 4. The displacement of the movable beam 16 in a manner that it remains facing the bearing part 22 when the latter is moved does not pose any problem. To make the system simple, the movable beam 16 is moved with the head 1, the two components beign connected by such means 19 as tenons cooperting with holes of flexible "silent"-blocks. When such an arrangement is used, the movable beam is translated transversally as the head is moved, and neither the head 1 nor its guiding supports 3, 4 are subjected to a stress when a force is applied by the tool.

In the embodiment shown in FIGS. 4 and 5, the head is moved on a first guiding support 4 which is oriented in the same direction as the beam 16. This first guiding support 4 is fixed along a frame or a carriage 7 which can move perpendicularly to the movable beam on a second guiding support 3 installed along the fixed beam 17. In order to maintain the movable beam 16 facing the bearing part 22 of the jack 20 of the head 1, it suffices to connect the movable frame 7 to the movable beam 16 by means such as 19 so as to transmit to the beam a movement oriented in the direction of the fixed beams 17; a movement taking place in the direction of the counter force should not be transmitted from the beam 16 to the mobile frame 7; this is easily achieved by orienting correctly the tenons and the holes 19. Connecting means 19 having a high flexibility in the desired direction such as the "silent"-blocks can also be used.

I claim:

1. An assembly robot for assembling parts comprising an assembly tool, a part holder (10) for the parts (11) in an assembly area and a head (1) carrying the assembly tool (21), wherein the head is movable with respect to the part holder by means of guiding supports (3, 4) and is positioned by motors (6), and wherein the head carries a device (20) for enabling application of the tool (21) to a part (11) with a predetermined force, and at least one platform (15, 16) mounted independently of said guiding supports and said head for absorbing the reaction to the force applied by said device, said device including a bearing part (22) placed in such a manner that the head (1) is between the platform (15, 16) and the part holder (10), said platform being mechanically coupled to the part holder by rigid elements (5) located outside an open space defined between the assembly area and the platform (15, 16) so as to be capable of withstanding a pushing force tending to push the platform away from the supports, and wherein the bearing part (22) is movable with respect to the head in the direction of said pushing force, and wherein said device further includes a jack constructed to move the tool axially while the head (1) is immobile, and to exert a force between the tool (21) and the bearing part (22) independently of the head, this latter force being transmitted by the tool (21) to the part (11), and the reaction to this force being transmitted by the bearing part (22) to the platform (15, 16) so that neither the head (1), nor its guiding supports (3, 4) are subjected to the force or to the reaction to this force.

2. A robot according to claim 1, characterized in that the jack is a jack fed by a fluid under presure, and that the device (20) with the jack are carried in a sliding mode by the head (1), the sliding movement taking place along the same direction as the force.

3. A robot according to claim 1, characterized in that the jack is a jack fed by a fluid under pressure having two oppositely oriented pistons (20') of the same section, the body of the jack being fixed to the head, one of the piston rods (26) carrying the tool (21), and the other piston rod (27) carrying the bearing part (22).

4. A robot according to one of claims 1 to 3, characterized in that a stop (28) integral with the bearing part (22) limits the displacement of the bearing part when the device is retracted to disengage the tool (21) from the part (11) to make it accessible.

5. A robot according to one of claims 1 to 3, characterized in that at least two of the guiding supports (3, 4) for the head (1) are oriented along two axes of cartesian co-ordinates, in that the platform (15, 16) is parallel to the plane defined by these two axes, in that the head (1) is moved along one of the cartesian axes on a first of said guiding supports (4) which is fixed on a movable frame (7), and in that the movable frame is moved along the second cartesian axis on a second of said guiding supports (3).

6. A robot according to one of claims 1 to 3, characterized in that the platform (16) is fixed.

7. A robot according to one of claims 1 to 3, and further comprising several platforms having different orientations.

8. A robot according to one of claims 1 to 3, characterized n that the platform (16) is movable with respect to the holder (10) for the parts (11) in at least one direction of translation or rotation which is the same as the direction of the movement of the head (1), and in that the robot comprises means (19) for moving together the head (5) and the platform (16) in that common direction.

9. A robot according to claim 5, characterized in that the platform is comprises of a beam (16) capable of moving transversally with a movement of translation, in that two fixed beams (17) are connected to the holder (10) for the parts (11) by rigid elements (5) located outside the space comprised between the assembly area and the platform (16) and are disposed perpendicularly to the movable beam (16) in such a manner that both ends (18) of the movable beam (16) are pressed against the fixed beam when the force is applied by the tool (21) to the part (11) and the reaction force is transmitted by the bearing part (22) to the movable beam (16), and that, when no force is applied on the tool, the ends (18) of the movable beam (16) are separated from the fixed beams (17) by a gap, thus enabling the driving means to move the movable beam transversally to maintain it facing the bearing part (22).

10. A robot according to claim 9, characterized in that the fixed beams (17) are parallel to the second guiding support (3) on which the movable frame (7) is moved, and in that cooperating means (19) are disposed on the movable frame (7) and the movable beams (16) in such an arrangment as to pull the movable beam (16) when the movable frame (7) is moved in the transversal direction, while avoiding that the reaction to the force applied to the part (11) be transmitted by the movable beam (16) to the movable frame (7).

* * * * *